United States Patent
Frederick, Jr. et al.

(10) Patent No.: US 11,068,639 B2
(45) Date of Patent: Jul. 20, 2021

(54) METAL LAYOUT TECHNIQUES

(71) Applicant: Arm Limited, Cambridge (GB)

(72) Inventors: Marlin Wayne Frederick, Jr., Austin, TX (US); Ettore Amirante, Nice (FR); Ronald Paxton Preston, Austin, TX (US); Andy Wangkun Chen, Austin, TX (US); Sriram Thyagarajan, Austin, TX (US); Yew Keong Chong, Austin, TX (US)

(73) Assignee: Arm Limited, Cambridge (GB)

( * ) Notice: Subject to any disclaimer, the term of this patent is extended or adjusted under 35 U.S.C. 154(b) by 47 days.

(21) Appl. No.: 16/165,675

(22) Filed: Oct. 19, 2018

(65) Prior Publication Data

US 2020/0125693 A1    Apr. 23, 2020

(51) Int. Cl.
*G06F 30/39* (2020.01)
*G06F 30/394* (2020.01)
*G11C 11/419* (2006.01)
*G11C 7/12* (2006.01)

(52) U.S. Cl.
CPC .............. *G06F 30/394* (2020.01); *G11C 7/12* (2013.01); *G11C 11/419* (2013.01)

(58) Field of Classification Search
CPC ........ G11C 11/419; G11C 11/412; G11C 7/12

USPC .......................................................... 365/154
See application file for complete search history.

(56) References Cited

U.S. PATENT DOCUMENTS

| | | | | |
|---|---|---|---|---|
| 5,111,434 A | * | 5/1992 | Cho | G11C 11/4091 365/207 |
| 8,044,437 B1 | * | 10/2011 | Venkatraman | H01L 27/1104 257/206 |
| 10,236,055 B1 | * | 3/2019 | Kumar | G11C 7/12 |
| 2004/0196705 A1 | * | 10/2004 | Ishikura | H01L 27/1104 365/200 |
| 2008/0181033 A1 | * | 7/2008 | Clinton | G11C 7/227 365/194 |
| 2016/0372180 A1 | * | 12/2016 | Amara | G11C 11/419 |

* cited by examiner

*Primary Examiner* — Han Yang
(74) *Attorney, Agent, or Firm* — Pramudji Law Group PLLC; Ari Pramudji

(57) ABSTRACT

Various implementations described herein refer to a method. The method may include providing a metal layout for an integrated circuit, wherein the metal layout includes multiple lines associated with bitlines. The method may include inserting at least one additional line between the multiple lines and the bitlines. The method may include arranging the at least one additional line with respect to the multiple lines and the bitlines so as to reduce capacitance associated with the bitlines.

22 Claims, 11 Drawing Sheets

METAL LAYOUT TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

As the semiconductor industry continues to scale-down feature density, it may be imperative to use advanced techniques, such as self-aligned multiple patterning, for fabrication. While this manufacturing technique may reduce a minimum pitch, it may have issues such as fixed spacing for SADP (self-aligned double patterning) and fixed spacing plus some line widths being fixed for SAQP (self-aligned quadruple patterning). The fixed spacing makes reducing bit capacitance by increasing spacing in the bitcell layout difficult, and the fixed line width makes it difficult to reduce VCC and bitline resistance in traditional bitcell layout. As area shrinks, a challenging problem arising in bitcell design may refer to reducing resistance and capacitance on bitlines, reducing resistance on VCC/VDD, and maintaining symmetric layout to reduce any process variations.

BRIEF DESCRIPTION OF THE DRAWINGS

Implementations of various metal layout techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to various metal layout schemes and techniques using bitline assist. In some implementations, the metal layout may refer to an integrated circuit having one or more memory cells, such as, e.g., 6T bitcells, with programmable metal lines in multi-pattern lithography. The metal layout schemes and techniques may provide for an innovative 6T bitcell first metal layer layout that is designed for low bitline resistance and capacitance and low VCC/VDD resistance while coping with the process manufacturing limitations of self-aligned multi-patterning lithography, such as SADP and SAQP.

Various implementations of metal layout schemes and techniques using bitline assist will now be described in greater detail herein with reference to FIGS. 1A-5C.

Figure 1A:
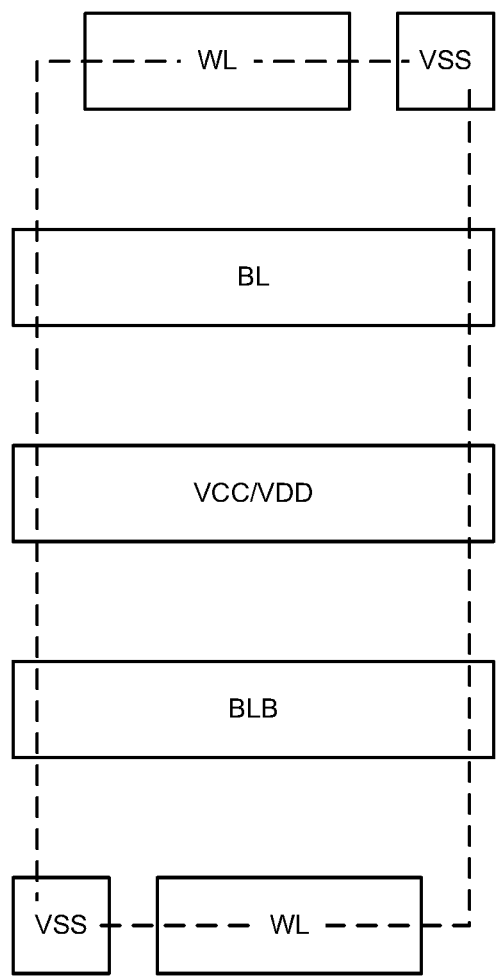
FIGS. 1A-1D illustrate diagrams of metal layout techniques in accordance with various implementations described herein.
Figure 1B:
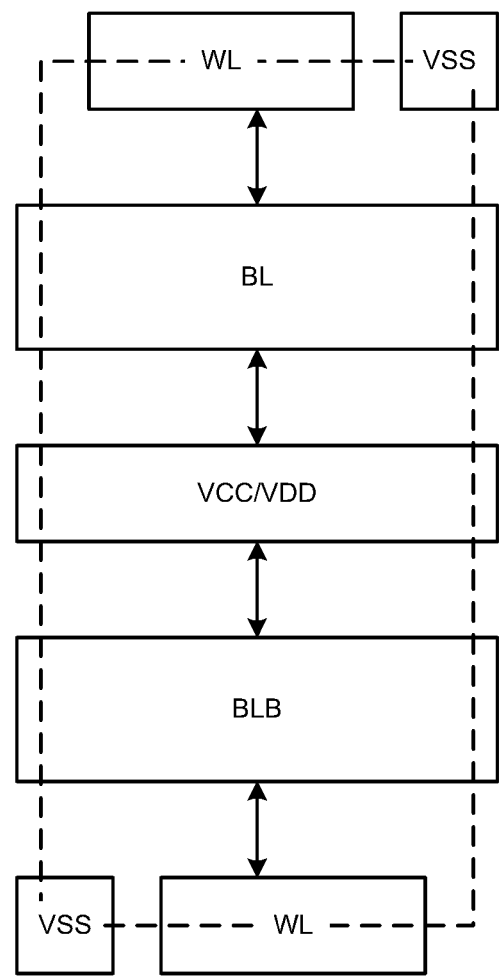
Figure 1C:
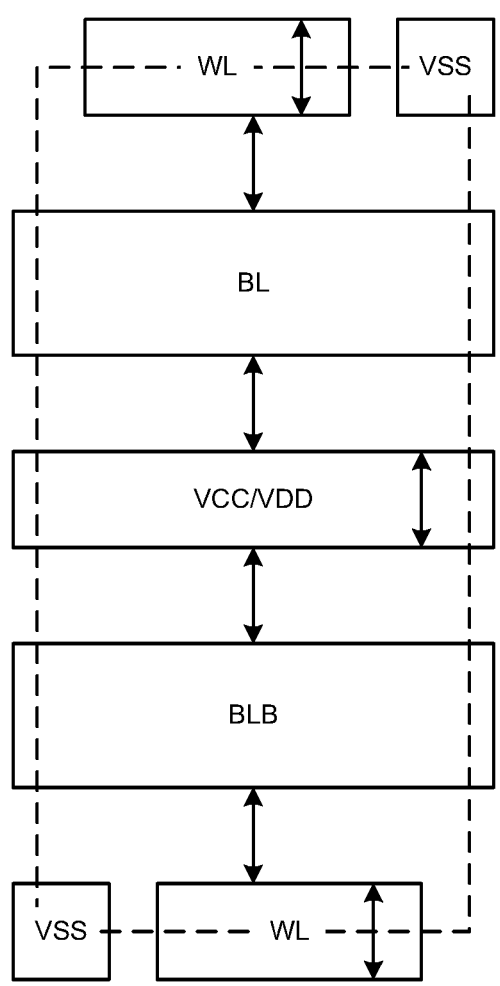
Figure 1D:
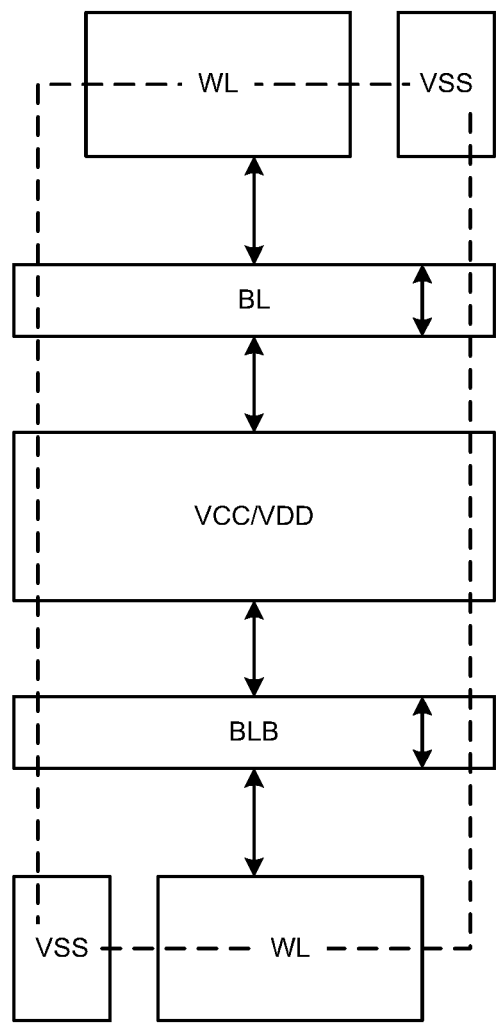

FIGS. 1A-1D illustrate diagrams of metal layout techniques in accordance with various implementations described herein. In particular, FIG. 1A shows a first metal layout 100A, FIG. 1B shows a second metal layout 100B, FIG. 1C shows a third metal layout 100C, and FIG. 1D shows a fourth metal layout 100D. In some implementations, the metal layout techniques may be associated with a bitcell first metal layer layout.

In reference to FIG. 1A, the first metal layout 100A refers to a first layer metal layout with variable spacing and line width freedom. FIG. 1A shows the first metal layout 100A with a wordline (WL), bitlines (BL, BLB), and voltage supply lines (VCC/VDD, VSS). The wordline (WL) may include a first portion of the wordline (WL) that is associated with and disposed adjacent to (or near) a first bitline (BL), and the wordline (WL) may include a second portion of the wordline (WL) that is associated with and disposed adjacent to (or near) a second bitline (BLB). The first portion and the second portion are part of the same wordline (WL), and the first and second portions of the wordline (WL) may be connected together at a higher layer. The bitlines (BL, BLB) may refer to complementary bitlines that include the first bitline (BL) and the second bitline (BLB) that is a complement to the first bitline (BL). The voltage supply lines may include a first voltage supply line (VCC/VDD) and a second voltage supply line (VSS). The first voltage supply line (VCC/VDD) may be associated with a high voltage supply source (e.g., >0V), and the second voltage supply line (VSS) may be associated with a low voltage supply source (e.g., 0V).

In reference to FIG. 1B, the second metal layout 100B refers to a first layer metal layout with fixed minimum spacing and line width freedom. FIG. 1B also shows that the second metal layout 100B is similar to the first metal layout 100A of FIG. 1A, wherein similar components have similar scope, features, and related characteristics as described herein. In reference to FIG. 1B, the double arrows indicate fixed minimum dimensions related to self-aligned multi-patterning, wherein the fixed minimum dimensions are related to spacing between lines. Also, as shown in FIG. 1B, the bitlines (BL, BLB) are wider than the bitlines (BL, BLB) shown in FIG. 1A.

In reference to FIG. 1C, the third metal layout 100C refers to a first layer metal layout with fixed minimum spacing and alternating lines at fixed minimum width. FIG. 1C also shows that the third metal layout 100C is similar to first and second metal layouts 100A, 100B of FIGS. 1A-1B, wherein similar components have similar scope, features, and related characteristics as described herein. In reference to FIG. 1C, the double arrows indicate fixed minimum dimensions related to self-aligned multi-patterning, wherein the fixed minimum dimensions are related to spacing between lines (as with FIG. 1B) and also related to line width of the wordlines (WL) and the first voltage supply line (VCC/VDD). Also, as shown in FIG. 1C, the bitlines (BL, BLB) are wider than the bitlines (BL, BLB) shown in FIG. 1A.

In reference to FIG. 1D, the fourth metal layout 100D refers to an alternate first layer metal layout with fixed minimum spacing and alternating lines at fixed minimum width. FIG. 1D also shows that the fourth metal layout 100D is similar to first, second and third metal layouts 100A, 100B, 100C of FIGS. 1A-1C, wherein similar components have similar scope, features, and related characteristics as described herein. In reference to FIG. 1D, the double arrows indicate fixed minimum dimensions related to self-aligned multi-patterning, wherein the fixed minimum dimensions are related to spacing between lines (as with FIG. 1B) and also related to line width of the bitlines (BL, BLB). Also, as shown in FIG. 1D, the wordlines (WL), the first voltage source line (VCC/VDD), and the second voltage source lines (VSS) are wider than similar lines (WL, VCC/VDD, VSS) shown in FIG. 1A. Further, as shown in FIG. 1D, the bitlines (BL, BLB) are narrower than the bitlines (BL, BLB) shown in FIGS. 1A-1C.

In reference to various power and performance reasons, an objective in metal layout design for bitline (BL, BLB) nets is to minimize (or at least reduce) their capacitance and resistance. The objective for the voltage supply (VCC/VDD) is to minimize (or at least reduce) its resistance. The first metal layout 100A of FIG. 1A may refer to a somewhat ideal metal layout characteristics for a bitcell. In reference to the first metal layout 100A, the VCC, BL, and BLB lines may be wider than minimum to assist with reducing resistance for those bitline nets, and in this instance, the BL and BLB lines may have extra spacing around them to reduce their capacitance. In the second metal layout 100B of FIG. 1B, it may be assumed that lithography, such as, e.g., self-aligned double patterning (SADP) lithography, fixes a minimum spacing between one or more or all lines. It may be possible to reduce the BL, BLB, and VCC resistance, but not the BL and BLB capacitance. Further, in third and fourth metal layouts 100C, 100D of FIGS. 1C-1D, it may be assumed that lithography, such as, e.g., self-align quadruple patterning (SAQP) lithography, requires all spacing to be minimum, along with any or every other metal line being minimum. This may result in a designer having to choose between making the BL and BLB resistance smaller and the VCC resistance large (e.g., as shown in third metal layout 100C of FIG. 1C) or the VCC resistance small and the BL and BLB resistance large (e.g., as shown in fourth metal layout 100D of FIG. 1D).

Figure 2A:
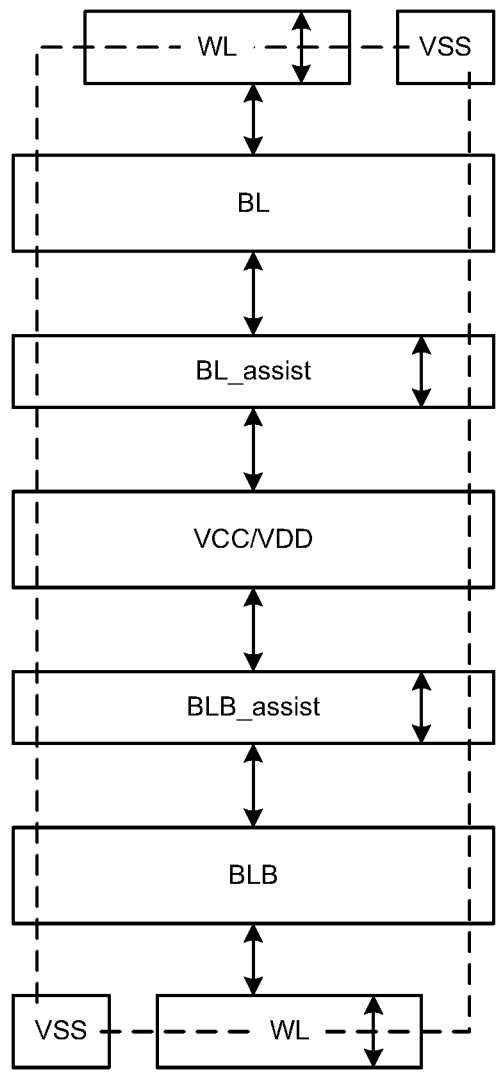
FIGS. 2A-2B illustrate diagrams of metal layout techniques using bitline assist in accordance with various implementations described herein.
Figure 2B:
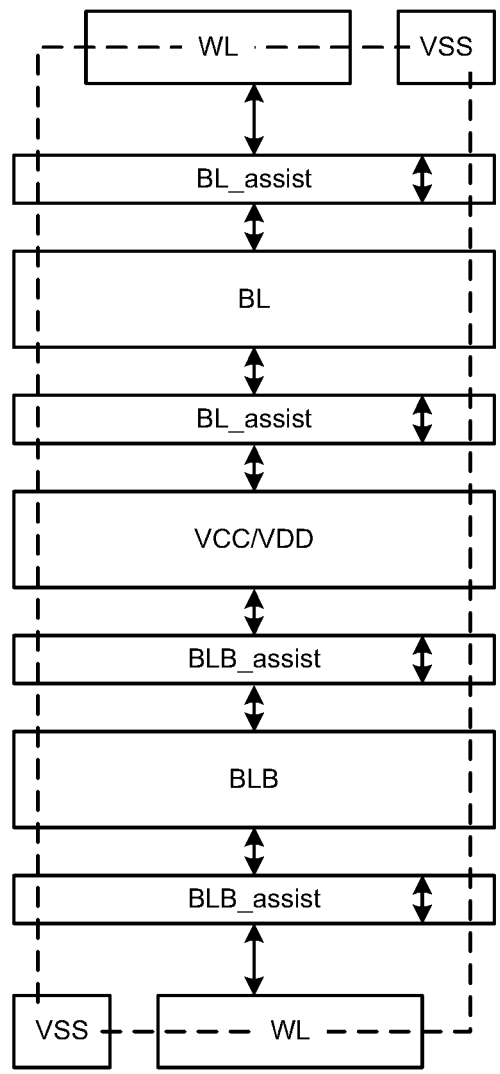

FIGS. 2A-2B illustrate diagrams of metal layout techniques using bitline assist in accordance with implementations described herein. In particular, FIG. 2A shows a first metal layout 200A with bitline assist (BL_assist, BLB_assist), and FIG. 2B shows a second metal layout 200B with bitline assist (BL_assist, BLB_assist). The double arrows indicate fixed minimum dimensions related to self-aligned multi-patterning, such as, e.g., SAQP lithography schemes and techniques.

In reference to FIG. 2A, the first metal layout 200A refers to a first layer metal layout with bitline assist (BL_assist, BLB_assist). FIG. 2A shows the first metal layout 200A with a wordline (WL), bitlines (BL, BLB), and voltage supply lines (VCC/VDD, VSS). The wordline (WL) may include a first portion of the wordline (WL) that is associated with and disposed adjacent to (or near) a first bitline (BL), and the wordline (WL) may include a second portion of the wordline (WL) that is associated with and disposed adjacent to (or near) a second bitline (BLB). The first portion and the second portion are part of the same wordline (WL), and the first and second portions of the wordline (WL) may be connected together at a higher layer. The bitlines (BL, BLB) may refer to complementary bitlines that include the first bitline (BL) and the second bitline (BLB) that is a complement to the first bitline (BL). The voltage supply lines may include a first voltage supply line (VCC/VDD) and a second voltage supply line (VSS). The first voltage supply line (VCC/VDD) may be associated with a high voltage supply source (e.g., >0V), and the second voltage supply line (VSS) may be associated with a low voltage supply source (e.g., 0V).

In some implementations, as shown in FIG. 2A, the bitline assist (BL_assist, BLB_assist) may include an additional floating assist line disposed between multiple lines (VCC/VDD and/or WL) and the bitlines (BL, BLB). In other implementations, as shown in FIG. 2B, bitline assist (BL_assist, BLB_assist) may include multiple additional floating assist lines disposed between the multiple lines (VCC/VDD and/or WLs) and the bitlines (BL, BLB). As described herein, the one or more additional floating assist lines (BL_assist, BLB_assist) may be arranged with respect to the multiple lines (VCC/VDD and/or WLs) and the bitlines (BL, BLB) so as to reduce capacitance associated with the bitlines (BL, BLB). In some instances, the metal layout 200A with bitline assist (BL_assist, BLB_assist) may be implemented with SAQP lithography schemes and techniques.

As shown in FIG. 2A, each of the additional floating assist lines (BL_assist, BLB_assist) may be implemented with at least one additional floating assist line per bitline (BL, BLB). For instance, a first floating assist line (BL_assist) may be associated with and disposed proximate to the first bitline (BL), and a second floating assist line (BLB_assist) may be associated with and disposed proximate to the second bitline (BLB). Further, the at least one additional floating assist line (BL_assist, BLB_assist) may be disposed to overlie or underlie the bitlines (BL/BLB, e.g., on top or bottom, or on both sides). In this instance, in reference to SAQP lithography, the metal layout 200A may have fixed minimum spacing between the multiple lines, and the wordlines (WLs) and the bitline assist lines (BL_assist, BLB_assist) may have fixed minimum line widths.

As shown in FIG. 2B, each of the additional floating assist lines (BL_assist, BLB_assist) may be implemented with multiple additional floating assist lines per bitline (BL, BLB). For instance, first floating assist lines (e.g., two or more BL_assist lines) may be associated with and disposed proximate to the first bitline (BL), such as, e.g., on either side of the first bitline (BL), and second floating assist lines (two or more BLB_assist lines) may be associated with and disposed proximate to the second bitline (BLB) such as, e.g., on either side of the second bitline (BLB). Further, the multiple additional floating assist lines (2 or more BL_assist lines, and 2 or more BLB_assist lines) may be disposed to overlie or underlie the bitlines (BL/BLB, e.g., on top or bottom, or on both sides). In this instance, in reference to SAQP lithography, the metal layout 200B may have fixed minimum spacing between the multiple lines, and the wordlines (WLs) and the multiple bitline assist lines (BL_assist, BLB_assist) may have fixed minimum line widths.

Figure 3A:
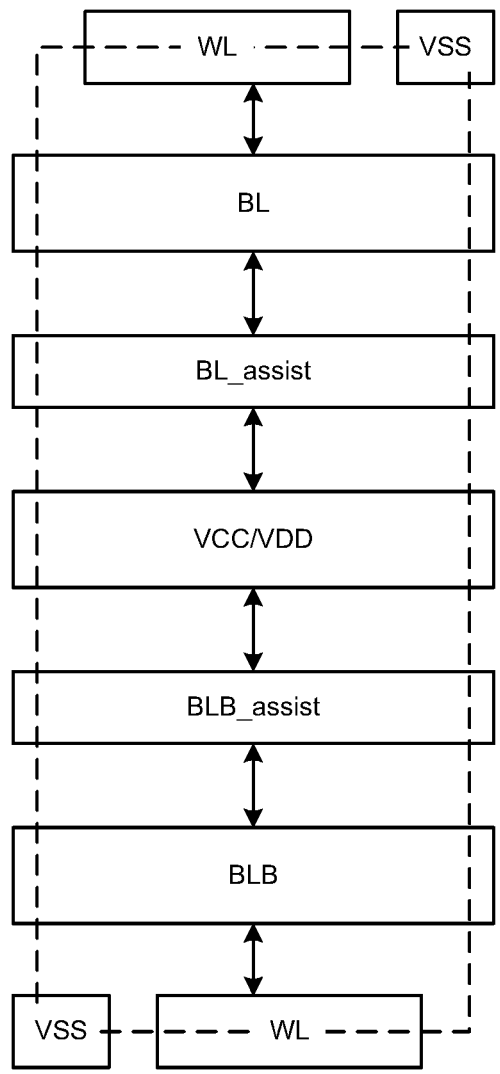
FIGS. 3A-3B illustrate other diagrams of metal layout techniques using bitline assist in accordance with various implementations described herein.
Figure 3B:
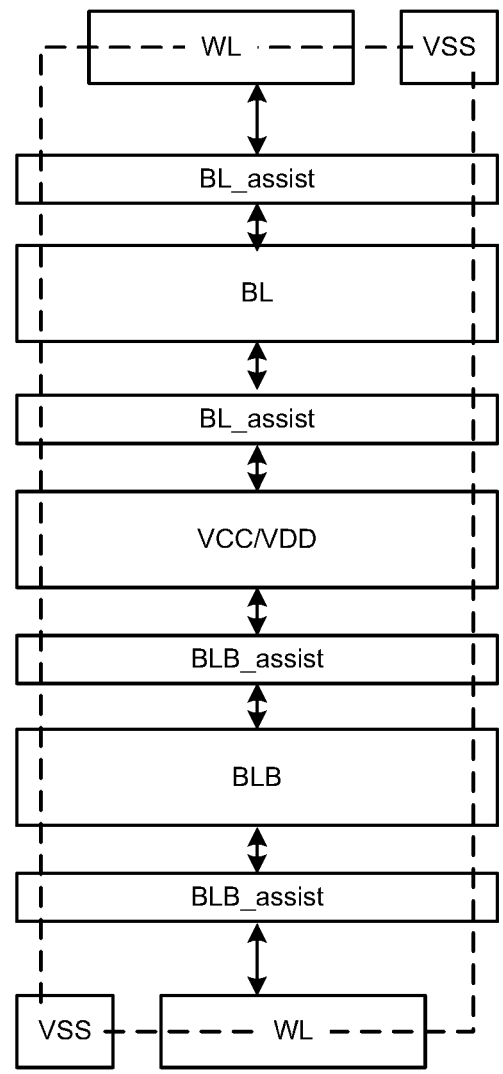

FIGS. 3A-3B illustrate diagrams of metal layout techniques using bitline assist in accordance with implementations described herein. In particular, FIG. 3A shows a first metal layout 300A with bitline assist (BL_assist, BLB_assist), and FIG. 3B shows a second metal layout 300B with bitline assist (BL_assist, BLB_assist). The double arrows indicate fixed minimum dimensions related to self-aligned multi-patterning, such as, e.g., SADP lithography schemes and techniques.

In reference to FIGS. 3A-3B, the first metal layout 300A refers to a first layer metal layout with bitline assist (BL_assist, BLB_assist), and the second metal layout 300B refers to another first layer metal layout with bitline assist (BL_assist, BLB_assist). Also, FIGS. 3A-3B show that the first and second metal layouts 300A, 300B are similar to the first and second metal layouts 200A, 200B of FIGS. 2A-2B, wherein similar components have similar scope, features, and related characteristics as described herein.

In some implementations, as shown in FIG. 3A, the bitline assist (BL_assist, BLB_assist) may include an additional floating assist line disposed between multiple lines (VCC/VDD and/or WL) and the bitlines (BL, BLB). In other implementations, as shown in FIG. 3B, bitline assist (BL_assist, BLB_assist) may include multiple additional floating assist lines disposed between the multiple lines (VCC/VDD and/or WLs) and the bitlines (BL, BLB). As described herein, the one or more additional floating assist lines (BL_assist, BLB_assist) may be arranged with respect to the multiple lines (VCC/VDD and/or WLs) and the bitlines (BL, BLB) so as to reduce capacitance associated with the bitlines (BL, BLB). In some instances, the metal layout 300A with bitline assist (BL_assist, BLB_assist) may be implemented with SADP lithography schemes and techniques.

As shown in FIG. 3A, each of the additional floating assist lines (BL_assist, BLB_assist) may be implemented with at least one additional floating assist line per bitline (BL, BLB). For instance, a first floating assist line (BL_assist) may be associated with and disposed proximate to the first bitline (BL), and a second floating assist line (BLB_assist) may be associated with and disposed proximate to the second bitline (BLB). Further, the at least one additional floating assist line (BL_assist, BLB_assist) may be disposed to overlie or underlie the bitlines (BL/BLB, e.g., on top or bottom, or on both sides). In this instance, in reference to SADP lithography, the metal layout 300A may have fixed minimum spacing between the multiple lines, and the wordlines (WLs) and the bitline assist lines (BL_assist, BLB_assist) may have variable line widths.

As shown in FIG. 3B, each of the additional floating assist lines (BL_assist, BLB_assist) may be implemented with multiple additional floating assist lines per bitline (BL, BLB). For instance, first floating assist lines (e.g., two or more BL_assist lines) may be associated with and disposed proximate to the first bitline (BL), such as, e.g., on either side of the first bitline (BL), and second floating assist lines (two or more BLB_assist lines) may be associated with and disposed proximate to the second bitline (BLB), such as, e.g., on either side of the second bitline (BLB). Further, the multiple additional floating assist lines (2 or more BL_assist lines, and 2 or more BLB_assist lines) may be disposed to overlie or underlie the bitlines (BL/BLB, e.g., on top or bottom, or on both sides). In this instance, in reference to SADP lithography, the metal layout 300B may have fixed minimum spacing between the multiple lines, and the wordlines (WLs) and the multiple bitline assist lines (BL_assist, BLB_assist) may have variable line widths.

In various implementations, in reference to FIGS. 2A-3B, the various bitline assist schemes and techniques described herein provide for introducing additional lines to the metal layout so as to reduce capacitance of the bitline BL and BLB net. The assist lines are indicated as BL_assist and BLB_assist in FIGS. 2A-3B. By floating assist lines (BL_assist, BLB_assist) proximate to the bitline (BL, BLB) nets, the side wall capacitance between the lines is effectively reduced due to series capacitance. In addition to reducing capacitance of the bitline (BL, BLB) nets, when SAQP lithography is used, it is possible to reduce resistance of bitlines (BL, BLB) and the first voltage supply line (VCC/VDD) by widening those metal lines. In some instances, only alternating metals may be limited to minimum width and SAQP, so it may be arranged such that the minimum width is applied to the assist lines (BL_assist, BLB_assist) as well as the WL and VSS nets. Also, in some instances, the bitline (BL, BLB) nets may be lithographed with the same processing and color so that their matching is maintained with this scheme and technique.

Also, in some implementations, in addition to floating the assist lines (BL_assist, BLB_assist) during read operations, the assist lines (BL_assist, BLB_assist) may also be programmed to implement a bitline write assist scheme during write operations. In this instance, write assist may be implemented as follows. In a first event, the metal assist lines may be precharged to VCC/VDD. In a second event, during write operations, at least one of the bitlines (BL, BLB) may be driven to VSS. In a third event, after the VSS bitline is driven to a low voltage state, the corresponding metal assist lines (BL_assist, BLB_assist) that are disposed adjacent (or proximate) to the VSS bitline may be driven to VSS. In various instances, the first event, the second event, and the third event may be in any order. This may result in coupling the corresponding metal assist lines (BL_assist, BLB_assist) to the bitlines (BL, BLB) and drive the bitline (BL, BLB) voltage negative so as to assist with flipping the logic (or voltage) state of a bitcell. These schemes and techniques are shown and described in greater detail herein below in reference to FIGS. 5A-5C.

Figure 4A:
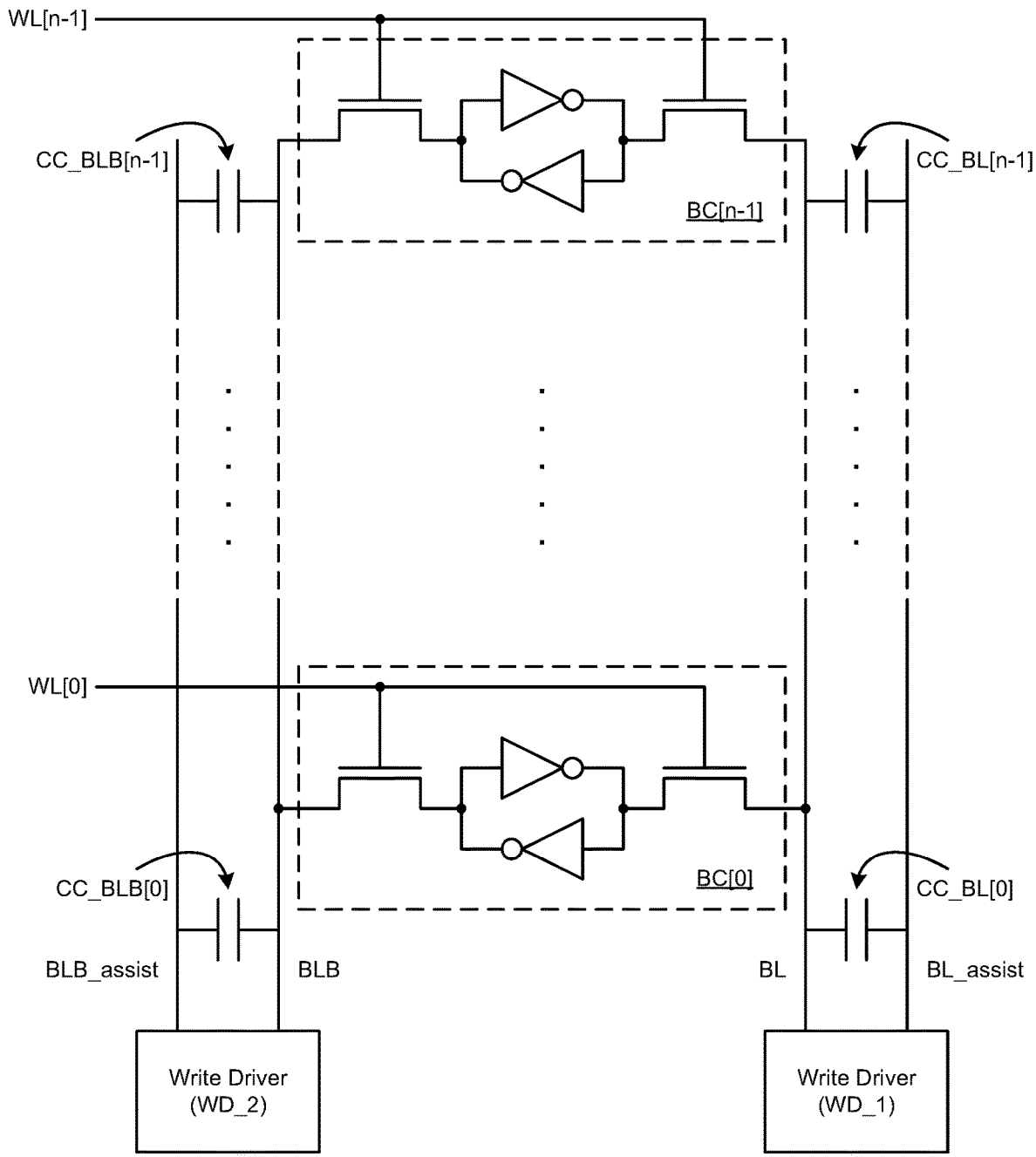
FIGS. 4A-4D illustrate diagrams of memory circuitry having bitline assist in accordance with various implementations described herein.
Figure 4B:
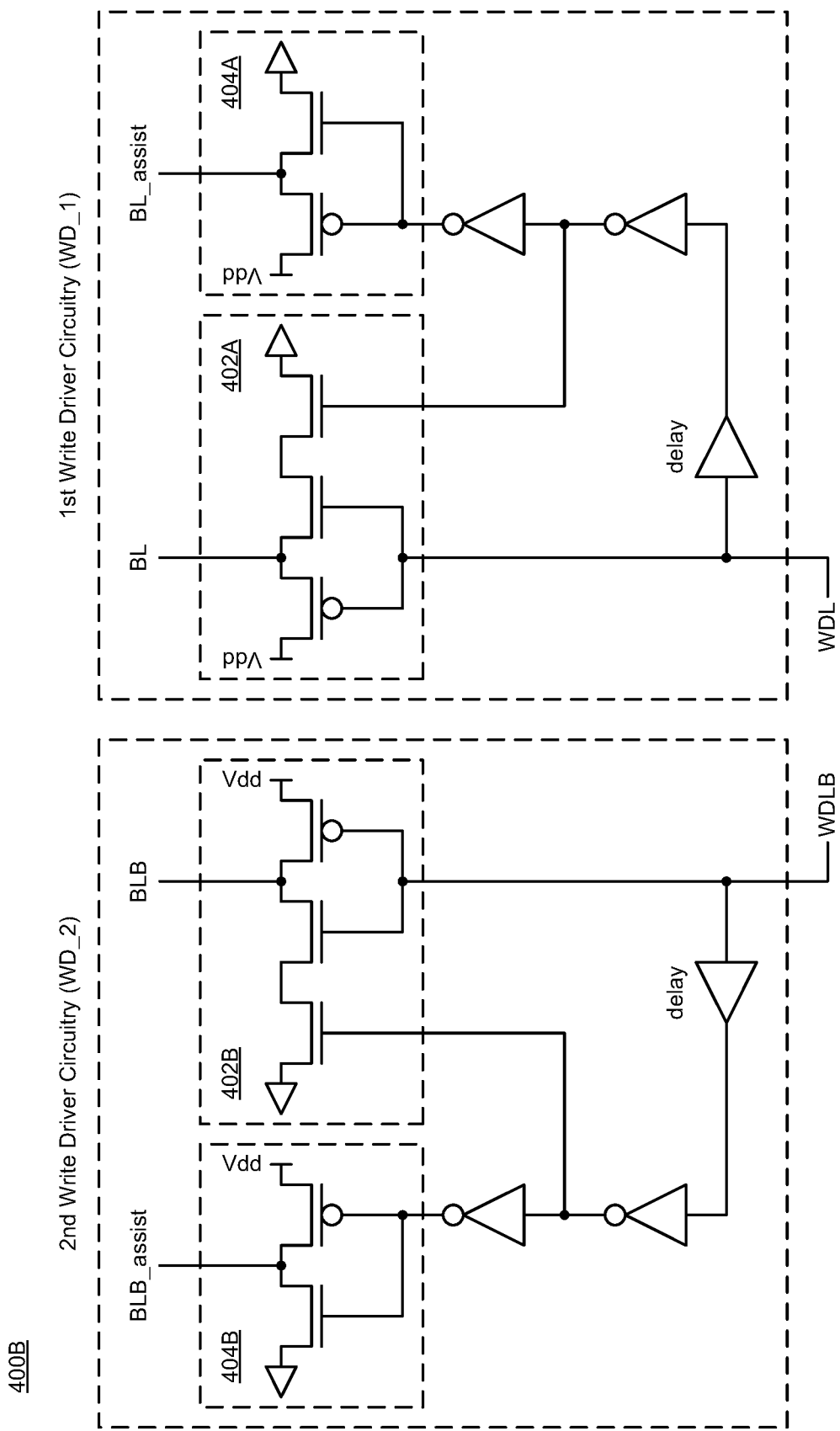
Figure 4C:
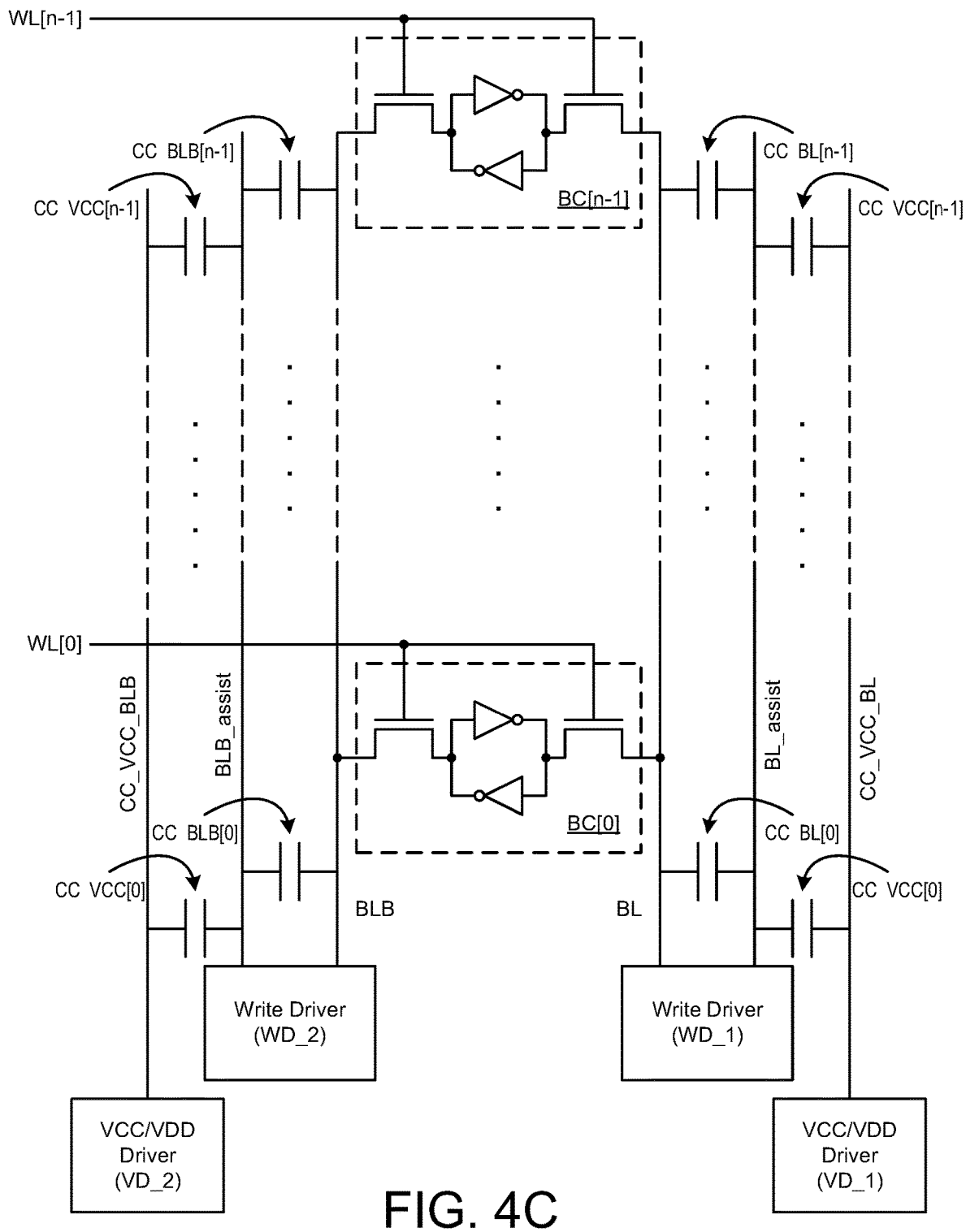
Figure 4D:
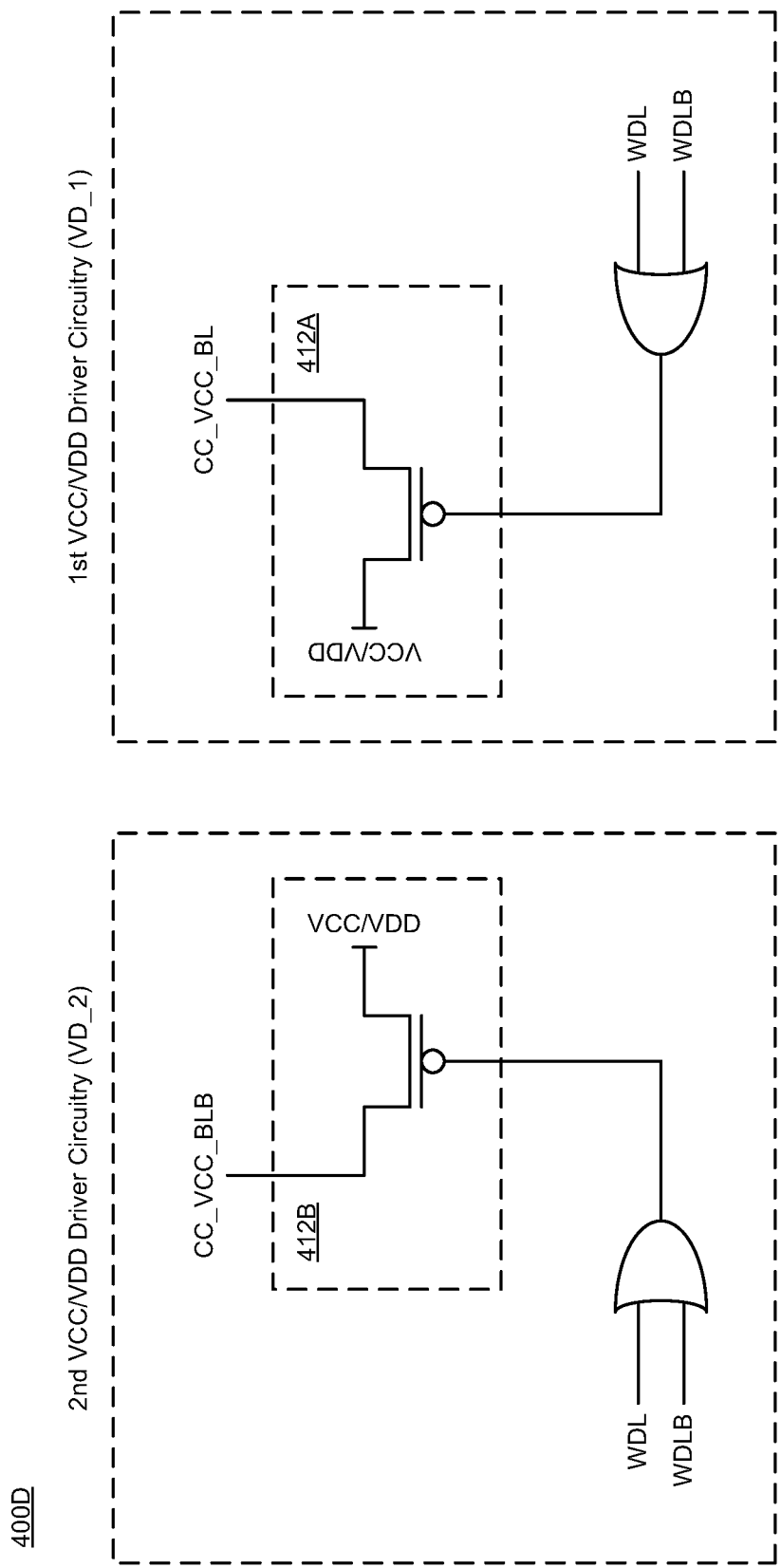

FIGS. 4A-4D illustrate diagrams of memory circuitry 400A, 400B, 400C, 400D having bitline assist in accordance with various implementations described herein. In particular, FIG. 4A illustrates a diagram of memory circuitry 400A having bitline assist circuitry (BL_assist, BLB_assist), FIG. 4B illustrates a diagram of memory circuitry 400B having write driver circuitry for driving the bitline assist circuitry (BL_assist, BLB_assist), FIG. 4C illustrates a diagram of memory circuitry 400C having bitline assist circuitry (BL_assist, BLB_assist) along with voltage supply lines (VCC/VDD), and FIG. 4D illustrates a diagram of memory circuitry 400D having VCC/VDD driver circuitry for driving the bitlines (BL/BLB).

As shown in FIG. 4A, the memory circuitry 400A includes an array of bitcells (BC[0], . . . , BC[n−1]) arranged in columns and rows, and each bitcell (BC[0], . . . , BC[n−1]) is accessible via bitlines (BL, BLB) and wordlines (WL[0], . . . , WL[n−1]). Also, each bitcell (BC[0], . . . , BC[n−1]) may be configured to store at least one data bit value (e.g., a data value related to a logical '0' or '1'). The bitlines (BL, BLB) include a first bitline (BL) and a second bitline (BLB) as a complement of the first bitline (BL). The memory circuitry 400A may include bitline assist lines (BL_assist, BLB_assist) corresponding to the bitlines (BL, BLB), respectively. Also, the memory circuitry 400A includes write drivers (WD_1, WD_2) coupled to the bitlines (BL, BLB), wherein a first write driver (WD_1) is coupled to the bitcells (BC[0], . . . , BC[n−1]) via the first bitline (BL), and the second write driver (WD_2) is coupled to the bitcells (BC[0], . . . , BC[n−1]) via the second bitline (BLB).

Also, as shown in FIG. 4A, the write drivers (WD_1, WD_2) may be coupled to the bitline assist lines (BL_assist, BLB_assist), which are disposed proximate to (or adjacent to, or near) the bitlines (BL, BLB), respectively, such that coupling capacitance (CC_BL[0], . . . , CC_BL[n−1] and CC_BLB[0], . . . , CC_BLB[n−1]) develops between the bitlines (BL, BLB) and the bitline assist lines (BL_assist, BLB_assist), respectively.

The array of bitcells (BC[0], . . . , BC[n−1]) may include any number of bitcells arranged in various configurations, such as, e.g., a two-dimensional (2D) memory array having any number of columns and any number of rows of multiple bitcells, which may be arranged in a 2D grid pattern with 2D indexing capabilities. Also, each bitcell (BC[0], . . . , BC[n−1]) may be implemented with random access memory (RAM) circuitry, and/or some other type of volatile memory. For instance, each bitcell may include a multi-transistor static RAM (SRAM) cell, including various types of SRAM cells, such as, e.g., 6T CMOS SRAM (as shown in FIG. 4A) and/or other type of complementary MOS (CMOS) SRAM cells, such as, e.g., 4T, 8T, 10T, or more transistors per bit. As described herein, the memory circuitry 400A may operate at a source voltage level (VCC/VDD) with a voltage range that varies with technology and memory application.

In reference to read operations, the bitline assist lines (BL_assist, BLB_assist) are floating before the start of the read operation. Further, in reference to write operations, the bitlines (BL, BLB) and the bitline assist lines (BL_assist, BLB_assist) are precharged to VCC/VDD. Next, one of the bitlines (either BL, or BLB) are driven to VSS (depending on writing a logic 0 or logic 1). Then, the bitline driver (or write driver for the bitline) is disconnected or decoupled. Then, one of the bitline assist lines (either BL_assist, or BLB_assist that is adjacent to the bitline BL/BLB driven to VSS) are driven to VSS. In some instances, since coupling capacitance (CC_BL[0], . . . , CC_BL[n−1] and CC_BLB [0], . . . , CC_BLB[n−1]) is directly next to the bitlines (BL, BLB) and along the length of bitlines (BL, BLB), this enhances the negative bitline lowering write assist.

As shown in FIG. 4B, the memory circuitry 400B may be implemented as write driver circuitry, e.g., with first write driver circuitry (WD_1) and second write driver circuitry (WD_2) of FIG. 4A. In some implementations, the write driver circuitry (WD_1, WD_2) may include BL write drivers (402A, 402B) and BLB write drivers (404A, 404B) along with various components that are arranged to write data to the bitcells (BC[0], . . . , BC[n−1]) in the memory circuitry 400A of FIG. 4A. For instance, as shown, the write driver circuitry (WD_1, WD_2) includes n-type transistors (NMOS), p-type transistors (PMOS), inverters and delays that are arranged to provide bitline signals to the bitlines (BL, BLB) and bitline assist signals to the bitline assist lines (BL_assist, BLB_assist). In some instances, during write operations, write driver line signals (WDL, WDLB) may be provided to corresponding write drivers (WD_1, WD_2), respectively, so as to activate bitline signals to bitlines (BL, BLB) and bitline assist signals to bitline assist lines (BL_assist, BLB_assist).

In reference to write operations, the write driver line signals (WDL, WDLB) are preset to VSS. Then, if writing a logic 0, WDL is driven to VCC/VDD. Then, after some delay, one of the bitlines (either BL, or BLB) are driven to VSS, and the bitline driver (NMOS) is cut-off. Then, one of the bitline assist lines (either BL_assist, or BLB_assist that is adjacent to the bitline BL/BLB driven to VSS) are driven to VSS.

As shown in FIG. 4C, the memory circuitry 400C is similar to the memory circuitry 400A of FIG. 4A, wherein similar features, components, and characteristics have the same scope and operational functionality. In FIG. 4C, the memory circuitry 400C includes the bitline assist circuitry (BL_assist, BLB_assist) along with voltage supply lines (CC_VCC_BL, CC_VCC_BLB).

In reference to read operations, the bitline assist lines (BL_assist, BLB_assist) are floating before the start of the read operation. Further, in reference to write operations, the bitlines (BL, BLB) and the bitline assist lines (BL_assist, BLB_assist) are precharged to VCC/VDD (CC_VCC_BL, CC_VCC_BLB). Next, one of the bitlines (either BL, or BLB) are driven to VSS (depending on writing a logic 0 or logic 1). The bitline driver (or write driver for the bitline) and/or the VCC/VDD driver (VD_1, VD_2) is then disconnected or decoupled. The bitline assist lines (either BL_assist, or BLB_assist) are then driven to VSS. In some instances, coupling capacitance (CC_VCC[0], . . . , CC_VCC[n−1]) is directly next to the bitlines (BL, BLB) and along the length of bitlines (BL, BLB), and this coupling capacitance may provide more effective negative boosting to write assist schemes and techniques. In other instances, the memory circuitry 400C may provide for NBL (negative bitline write assist) and/or TVC (transient voltage collapse write assist), either separately (i.e., one or the other), or at the same time, so as to improve write assist.

In some instances, as shown in FIG. 4C, the VCC/VDD drivers (VD_1, VD_2) may be coupled to the voltage supply lines (CC_VCC_BL, CC_VCC_BLB), which are disposed proximate to (or adjacent to, or near) the bitline assist lines (BL_assist, BLB_assist), respectively, such that coupling capacitance (CC_VCC[0], . . . , CC_VCC[n−1]) develops between the voltage supply lines (CC_VCC_BL, CC_VCC_BLB) and the bitline assist lines (BL_assist, BLB_assist), respectively. In other instances, the VCC/VDD drivers (VD_1, VD_2) may be coupled to the voltage supply lines (CC_VCC_BL, CC_VCC_BLB), so as to be disposed proximate to (or adjacent to, or near) the bitlines (BL, BLB), respectively, such that the coupling capacitance (CC_VCC [0], . . . , CC_VCC[n−1]) develops between the voltage supply lines (CC_VCC_BL, CC_VCC_BLB) and the bitlines (BL, BLB), respectively.

As shown in FIG. 4D, the memory circuitry 400D may be implemented as VCC/VDD driver circuitry, e.g., with first VCC/VDD driver circuitry (VD_1) and second VCC/VDD driver circuitry (VD_2) of FIG. 4C. In some implementations, the VCC/VDD driver circuitry (VD_1, VD_2) may include VCC/VDD drivers (412A, 412B) along with various components that are arranged to drive the voltage supply lines (CC_VCC_BL, CC_VCC_BLB) in the memory circuitry 400C of FIG. 4C. For instance, the VCC/VDD drivers (412A, 412B) may include at least one transistor (e.g., p-type transistor (PMOS)) along with use of at least one logic gate (e.g., OR gate) that are arranged to provide power supply signals (CC_VCC_BL, CC_VCC_BLB) from the voltage supply (VCC/VDD) to the voltage supply lines (CC_VCC_BL, CC_VCC_BLB). In some instances, during write operations, preset signals (WDL, WDLB) may be provided to corresponding VCC/VDD drivers (VD_1, VD_2), respectively, so as to preset the voltage supply lines (CC_VCC_BL, CC_VCC_BLB) to VSS (or ground (GND)). Next, if a write operation is being performed, then at least one of the preset signals (WDL, WDLB) rises to VCC/VDD. Next, the VCC/VDD drivers (412A, 412B) are cut-off.

Figure 5A:
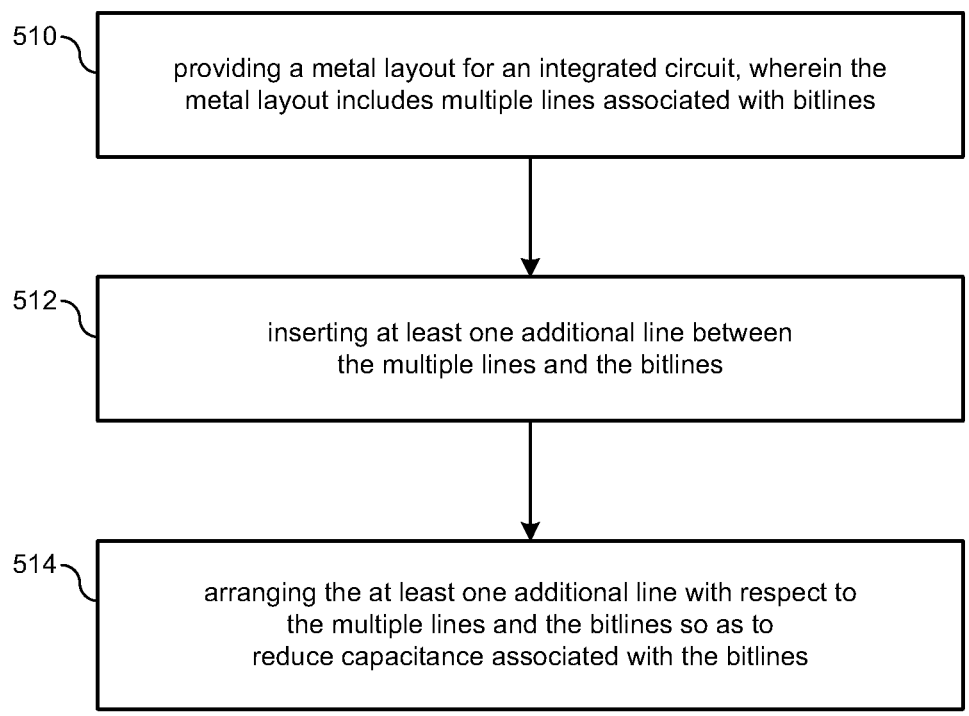
FIGS. 5A-5C illustrate process flow diagrams of methods for providing a metal layout with bitline assist in accordance with implementations described herein.
Figure 5B:
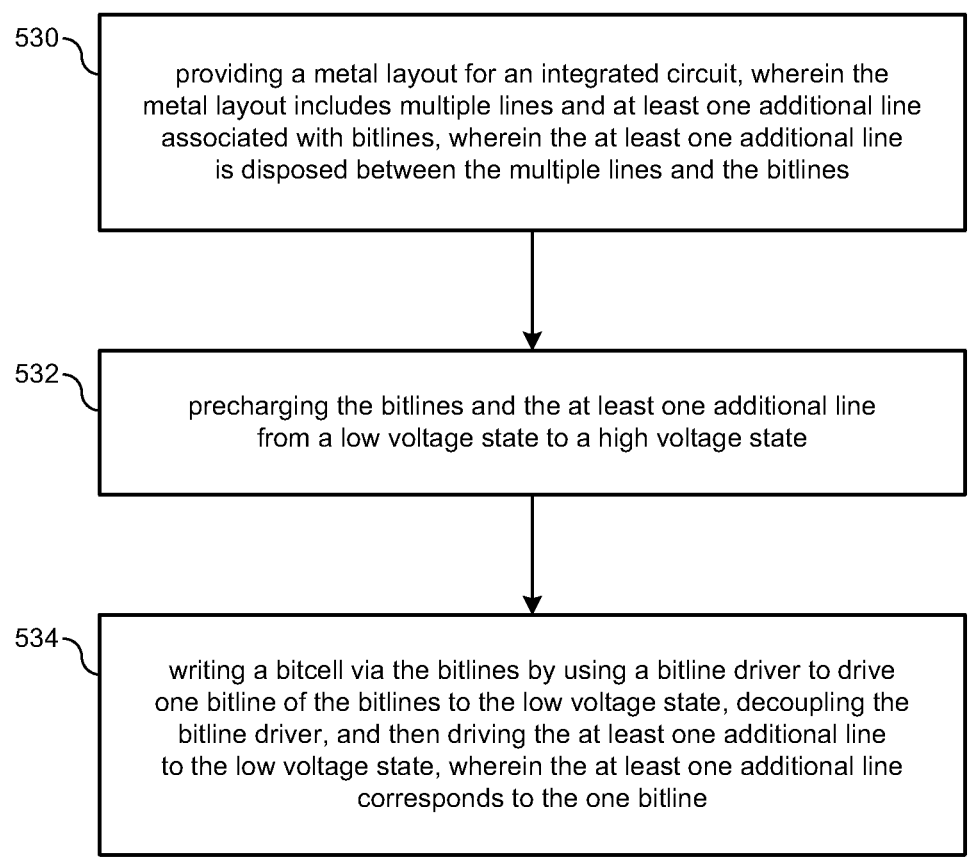
Figure 5C:
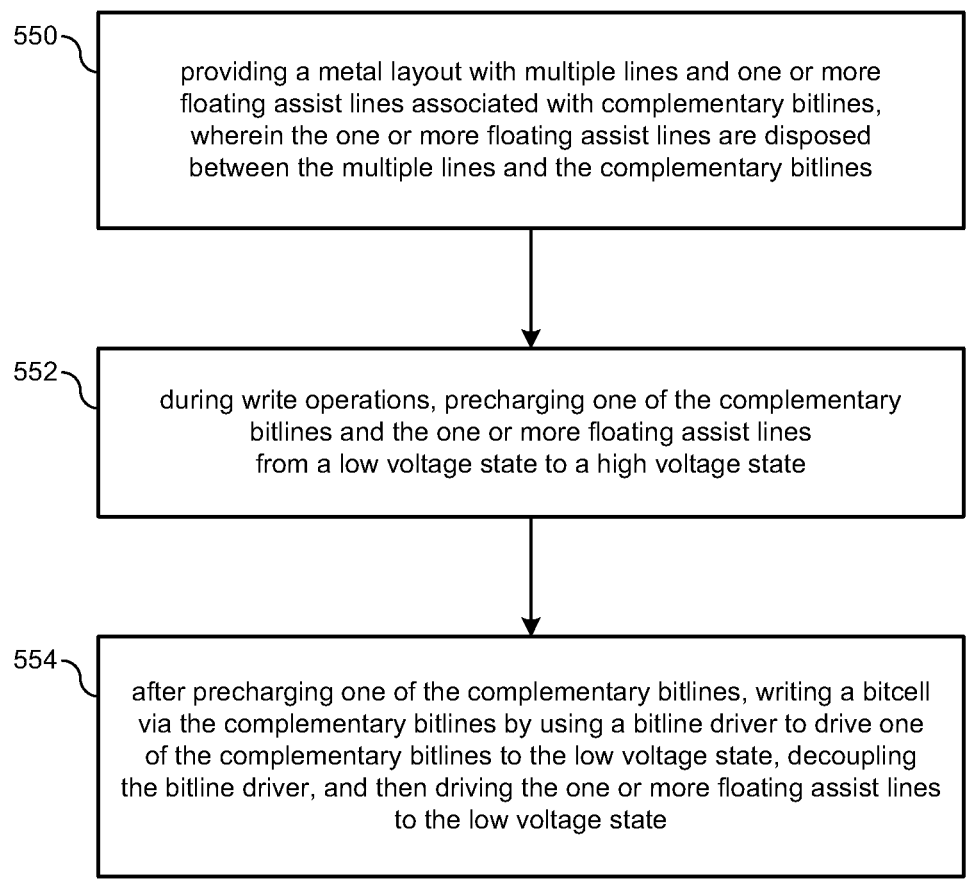

FIGS. 5A-5C illustrate process flow diagrams of methods for providing a metal layout with bitline assist in accordance with implementations described herein.

FIG. 5A illustrates a process flow diagram of a method 500A for providing a metal layout with bitline assist in accordance with implementations described herein.

It should be understood that even though method 500A indicates a particular order of operation execution, in some cases, various certain portions of the operations may be executed in a different order, and on different systems. In other cases, additional operations and/or steps may be added to and/or omitted from method 500A. Also, method 500A may be implemented in hardware and/or software. If implemented in hardware, the method 500A may be implemented with various components and/or circuitry, as described herein in reference to FIGS. 1A-4B. If implemented in software, method 500A may be implemented as a program or software instruction process that is configured for providing a metal layout with bitline assist, as described herein. Further, if implemented in software, instructions related to implementing the method 500A may be stored in memory and/or a database. For instance, a computer or various other types of computing devices having a processor and memory may be configured to perform method 500A.

As described and shown in reference to FIG. 5A, method 500A may be used for fabricating and/or manufacturing, or causing to be fabricated and/or manufactured, an integrated circuit (IC) that implements the various metal layout schemes and techniques as described herein that are associated with bitline assist and/or various related devices, components and circuitry. In some implementations, method 500A may be used for read operations using bitline assist lines to assist the read operations.

At block 510, method 500A may provide a metal layout for an integrated circuit, wherein the metal layout may include multiple lines associated with bitlines. The multiple lines may be implemented with metal lines, and the multiple lines may provide conductive paths that are associated with one or more of a high power supply (VCC/VDD), a low power supply (VSS), and one or more wordlines (WLs). The multiple lines may have variable line width and/or variable spacing between the multiple lines. The bitlines may refer to complementary bitlines that include a first bitline and a second bitline that is a complement to the first bitline.

At block 512, method 500A may insert at least one additional line between the multiple lines and the bitlines. The at least one additional line may be implemented with at least one additional floating line per bitline. The at least one additional line may refer to at least one additional assist line per bitline. The at least one additional line may be implemented with at least one assist line that is disposed to overlie or underlie the bitlines (e.g., top or bottom, on both sides).

At block 514, method 500A may arrange the at least one additional line with respect to the multiple lines and the bitlines so as to reduce capacitance associated with the bitlines. In some implementations, in reference to read operations, the assist lines may be configured to float, and the assist lines may also be configured to assist the read operations while floating. In some implementations, in reference to write operations, the bitlines and the assist lines may be driven low in sequence so as to assist write operations while driving the bitlines and the assist lines. This technique is described in greater detail herein below in reference to method 500B of FIG. 5B.

FIG. 5B illustrates a process flow diagram of a method 500B for providing a metal layout with bitline assist in accordance with implementations described herein.

It should be understood that even though method 500B indicates a particular order of operation execution, in some cases, various certain portions of the operations may be executed in a different order, and on different systems. In other cases, additional operations and/or steps may be added to and/or omitted from method 500B. Also, method 500B may be implemented in hardware and/or software. If implemented in hardware, the method 500B may be implemented with various components and/or circuitry, as described herein in reference to FIGS. 1A-4B. If implemented in software, method 500B may be implemented as a program or software instruction process that is configured for providing a metal layout with bitline assist, as described herein. Further, if implemented in software, instructions related to implementing the method 500B may be stored in memory and/or a database. For instance, a computer or various other types of computing devices having a processor and memory may be configured to perform method 500B.

As described and shown in reference to FIG. 5B, method 500B may be used for fabricating and/or manufacturing, or causing to be fabricated and/or manufactured, an integrated circuit (IC) that implements the various metal layout schemes and techniques as described herein that are associated with bitline assist and/or various related devices, components and circuitry. In some implementations, method 500B may be used for write operations using bitline assist lines to assist the write operations.

At block 530, method 500B may provide a metal layout for an integrated circuit, wherein the metal layout includes multiple lines and at least one additional line associated with bitlines. The at least one additional line may be disposed between the multiple lines and the bitlines. The multiple lines may be implemented with metal lines that provide conductive paths that are associated with one or more of a high power supply (VCC/VDD), a low power supply (VSS), and one or more wordlines (WLs). The multiple lines may have variable line width and/or variable spacing between the multiple lines. The at least one additional line refers to at least one additional assist line per bitline. The at least one additional line may be implemented with at least one floating assist line per bitline, and the at least one floating assist line may be disposed to overlie or underlie the bitlines (top or bottom, on both sides).

At block 532, method 500B may precharge the bitlines and the at least one additional line from a low voltage state to a high voltage state. In some instances, the low voltage state may refer to low voltage of 0V (e.g., a logic 0 state), and the high voltage state may refer to high voltage of >0V (e.g., a logic 1 state).

At block 534, method 500B may write a bitcell via the bitlines by using a bitline driver to drive one bitline of the bitlines to the low voltage state, decoupling the bitline driver, and then driving the at least one additional line to the low voltage state. The at least one additional line may correspond to the one bitline. The bitline driver may be disconnected (or decoupled) before driving the one or more additional lines to the low voltage state. As such, for write operations, after driving the bitline to the low voltage state, the corresponding bitline assist line associated with the bitline should be driven to the low voltage state. Further, the bitcell may be implemented with a random access memory (RAM) cell having multiple transistors arranged to store multiple logic states related to the low voltage state and the high voltage state.

FIG. 5C illustrates a process flow diagram of a method 500C for providing a metal layout with bitline assist in accordance with implementations described herein.

It should be understood that even though method 500C indicates a particular order of operation execution, in some cases, various certain portions of the operations may be executed in a different order, and on different systems. In other cases, additional operations and/or steps may be added to and/or omitted from method 500C. Also, method 500C may be implemented in hardware and/or software. If implemented in hardware, the method 500C may be implemented with various components and/or circuitry as described herein in reference to FIGS. 1A-4B. If implemented in software, method 500C may be implemented as a program or software instruction process that is configured for providing a metal layout with bitline assist, as described herein.

Further, if implemented in software, instructions related to implementing the method 500C may be stored in memory and/or a database. For instance, a computer or various other types of computing devices having a processor and memory may be configured to perform method 500C.

As described and shown in reference to FIG. 5C, method 500C may be used for fabricating and/or manufacturing, or causing to be fabricated and/or manufactured, an integrated circuit (IC) that implements the various metal layout schemes and techniques as described herein that are associated with bitline assist and/or various related devices, components and circuitry. In some implementations, method 500C may be used for read and write operations using bitline assist lines to assist the read and write operations.

At block 550, method 500C may provide a metal layout with multiple lines and one or more floating assist lines associated with complementary bitlines, wherein the one or more floating assist lines may be disposed between the multiple lines and the complementary bitlines. The multiple lines may be implemented with metal lines that provide conductive paths that are associated with one or more of a high power supply (VCC/VDD), a low power supply (VSS), and one or more wordlines (WLs). The one or more floating assist lines may include at least one floating assist line per bitline, and the at least one floating assist line may be disposed to overlie or underlie the bitlines (e.g., top or bottom, or on both sides). In some implementations, the floating assist lines may be used to improve read operations, as described herein.

At block 552, method 500C may precharge the bitlines and the one or more floating assist lines, during write operations, from a low voltage state to a high voltage state. In some instances, as described herein above, the low voltage state may refer to low voltage of 0V (e.g., a logic 0 state), and the high voltage state may refer to high voltage of >0V (e.g., a logic 1 state).

At block 554, method 500A may write a bitcell via the bitlines, after precharging the bitlines, by using a bitline driver to drive at least one of the bitlines to the low voltage state, decoupling the bitline driver, and then driving the one or more floating assist lines to the low voltage state. The bitline driver may be decoupled (or disconnected) before driving the one or more floating assist lines to the low voltage state. The bitcell may be implemented with a RAM cell having multiple transistors arranged to store multiple logic states related to the low voltage state and the high voltage state.

In some implementations, method 500C may further include arranging the one or more floating assist lines with respect to the multiple lines and the bitlines so as to reduce capacitance associated with the bitlines. This bitline assist scheme and technique is described in greater detail herein above in reference to FIGS. 2A-3B.

Some advantages of bitline assist schemes and techniques described herein refer to one or more of the following. In reference to power characteristics, significant amounts of memory dynamic power may be consumed in precharging and discharging of bitlines. As such, the bitline assist schemes and techniques described herein may reduce bitline capacitance and thus reduce dynamic power. By reducing bitline capacitance, read current of the bitcell may be reduced and performance maintained. Also, reducing read current may allow for reducing static power of the bitcell as well. Further, in reference to performance and timing, reduction in bitline capacitance may result in faster memory read times. Also, direct bitline coupling may offer an efficient BL write assist to improve write margin and write timing as well.

Described herein are various implementations of a method. The method may include providing a metal layout for an integrated circuit, wherein the metal layout includes multiple lines associated with bitlines. The method may include inserting at least one additional line between the multiple lines and the bitlines. The method may include arranging the at least one additional line with respect to the multiple lines and the bitlines so as to reduce capacitance associated with the bitlines.

Described herein are various implementations of a method. The method may include providing a metal layout for an integrated circuit, wherein the metal layout includes multiple lines and at least one additional line associated with bitlines, and wherein the at least one additional line is disposed between the multiple lines and the bitlines. The method may include precharging the bitlines and the at least one additional line from a low voltage state to a high voltage state. The method may include writing a bitcell via the bitlines by using a bitline driver to drive one bitline of the bitlines to the low voltage state, decoupling the bitline driver, and then driving the at least one additional line to the low voltage state, wherein the at least one additional line corresponds to the one bitline.

Described herein are various implementations of a method. The method may include providing a metal layout with multiple lines and one or more floating assist lines associated with complementary bitlines, wherein the one or more floating assist lines are disposed between the multiple lines and the complementary bitlines. The method may include, during write operations, precharging one of the complementary bitlines and the one or more floating assist lines from a low voltage state to a high voltage state. The method may include, after precharging one of the complementary bitlines, writing a bitcell via the complementary bitlines by using a bitline driver to drive one of the complementary bitlines to the low voltage state, decoupling the bitline driver, and then driving the one or more floating assist lines to the low voltage state.

Described herein are various implementations of a method. The method may include providing a metal layout for an integrated circuit, wherein the metal layout includes multiple lines and at least one additional line associated with bitlines, and wherein the at least one additional line is disposed between the multiple lines and the bitlines. The method may include precharging the bitlines and the at least one additional line from a low voltage state to a high voltage state. The method may include writing a bitcell via the bitlines by using a bitline driver to drive one bitline of the bitlines to the low voltage state, decoupling a high power supply (VCC/VDD) driver, and then driving the at least one additional line to the low voltage state, wherein the at least one additional line corresponds to the one bitline.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
    providing a metal layout for an integrated circuit, wherein the metal layout includes multiple lines associated with bitlines;
    inserting at least one additional line between the multiple lines and the bitlines; and
    arranging the at least one additional line adjacent to and extending along a length of at least one of the bitlines so as to reduce capacitance associated with the bitlines, wherein the at least one additional line and the at least one of the bitlines are coupled to a bitline driver.

2. The method of claim 1, wherein the multiple lines comprise metal lines that provide conductive paths that are associated with one or more of a high power supply (VCC/VDD), a low power supply (VSS), and one or more wordlines (WLs) or portions thereof.

3. The method of claim 1, wherein the multiple lines have at least one of variable line width and variable spacing between the multiple lines.

4. The method of claim 1, wherein the bitlines refer to complementary bitlines that include a first bitline and a second bitline that is a complement to the first bitline.

5. The method of claim 1, wherein the at least one additional line comprises at least one additional floating line per bitline.

6. The method of claim 1, wherein the at least one additional line refers to at least one additional assist line per bitline, and wherein the at least one additional assist line is arranged to generate series capacitance and reduce side wall capacitance of the bitlines.

7. The method of claim 1, wherein the at least one additional line comprises at least one assist line that is disposed parallel to and in the same direction to the at least one of the bitlines, and wherein the at least one assist line is coupled to the at least one of the bitlines by a capacitor to form a coupling capacitance.

8. A method, comprising:
    providing a metal layout for an integrated circuit, wherein the metal layout includes multiple lines and at least one additional line associated with bitlines, wherein the at least one additional line is disposed between the multiple lines and the bitlines;
    precharging the bitlines and the at least one additional line from a low voltage state to a high voltage state; and
    writing a bitcell via the bitlines by using a bitline driver to drive one bitline of the bitlines to the low voltage state, decoupling the bitline driver, and then driving the at least one additional line to the low voltage state, wherein the at least one additional line corresponds to the one bitline.

9. The method of claim 8, wherein the multiple lines comprise metal lines that provide conductive paths that are associated with one or more of a high power supply (VCC/VDD), a low power supply (VSS), and one or more wordlines (WLs) or portions thereof.

10. The method of claim 8, wherein the multiple lines have at least one of variable line width and variable spacing between the multiple lines.

11. The method of claim 8, wherein the bitline driver is decoupled before driving the one or more additional lines to the low voltage state.

12. The method of claim 8, wherein the at least one additional line refers to at least one additional assist line per bitline.

13. The method of claim 8, wherein the at least one additional line comprises at least one floating assist line per bitline, and wherein the at least one floating assist line is disposed to overlie or underlie the bitlines.

14. The method of claim 8, wherein the bitcell comprises a random access memory (RAM) cell having multiple transistors arranged to store multiple logic states related to the low voltage state and the high voltage state.

15. A method, comprising:
providing a metal layout with multiple lines and one or more floating assist lines associated with complementary bitlines, wherein the one or more floating assist lines are disposed between the multiple lines and the complementary bitlines;
during write operations, precharging one of the complementary bitlines and the one or more floating assist lines from a low voltage state to a high voltage state;
after precharging one of the complementary bitlines, writing a bitcell via the complementary bitlines by using a bitline driver to drive one of the complementary bitlines to the low voltage state, decoupling the bitline driver, and then driving the one or more floating assist lines to the low voltage state.

16. The method of claim 15, wherein the multiple lines comprise metal lines that provide conductive paths that are associated with one or more of a high power supply (VCC/VDD), a low power supply (VSS), and one or more wordlines (WLs) or portions thereof.

17. The method of claim 15, further comprising: arranging the one or more floating assist lines with respect to the multiple lines and the bitlines so as to reduce capacitance associated with the bitlines.

18. The method of claim 15, wherein the bitline driver is decoupled before driving the one or more floating assist lines to the low voltage state.

19. The method of claim 15, wherein the one or more floating assist lines comprise at least one floating assist line per bitline, and wherein the at least one floating assist line is disposed to overlie or underlie the bitlines.

20. The method of claim 15, wherein the bitcell comprises a random access memory (RAM) cell having multiple transistors arranged to store multiple logic states related to the low voltage state and the high voltage state.

21. A method, comprising:
providing a metal layout for an integrated circuit, wherein the metal layout includes multiple lines and at least one additional line associated with bitlines, wherein the at least one additional line is disposed between the multiple lines and the bitlines;
precharging the bitlines and the at least one additional line from a low voltage state to a high voltage state; and
writing a bitcell via the bitlines by using a bitline driver to drive one bitline of the bitlines to the low voltage state, decoupling a high power supply (VCC/VDD) driver, and then driving the at least one additional line to the low voltage state, wherein the at least one additional line corresponds to the one bitline.

22. The method of claim 21, further comprising decoupling the bitline driver along with decoupling the high power supply (VCC/VDD) driver.

* * * * *